(12) United States Patent
Song

(10) Patent No.: US 6,229,736 B1
(45) Date of Patent: May 8, 2001

(54) METHOD OF ERASING FLASH MEMORY AND SUBSTRATE VOLTAGE SUPPLY CIRCUIT

(75) Inventor: Bok Nam Song, Kyungki-Do (KR)

(73) Assignee: Hyundai Electronics Industries Co., Ltd., Kyungki-do (KR)

( * ) Notice: Subject to any disclaimer, the term of this patent is extended or adjusted under 35 U.S.C. 154(b) by 0 days.

(21) Appl. No.: 09/428,983

(22) Filed: Oct. 28, 1999

(30) Foreign Application Priority Data

Oct. 29, 1998 (KR) .................................. 98-45965

(51) Int. Cl.$^7$ .................................. G11C 16/04
(52) U.S. Cl. .................. 365/185.29; 365/185.22; 365/185.27; 365/185.3
(58) Field of Search .......... 365/185.29, 185.3, 365/185.18, 185.22, 185.33, 185.27

(56) References Cited

U.S. PATENT DOCUMENTS

| | | | |
|---|---|---|---|
| 5,375,094 | 12/1994 | Naruke | 365/222 |
| 5,428,621 | 6/1995 | Mehrotra et al. | 371/21.4 |
| 5,465,236 | 11/1995 | Naruke | 365/218 |
| 5,467,306 | * 11/1995 | Kaya et al. | 365/185.3 |
| 5,487,033 | * 1/1996 | Keeney et al. | 365/185.19 |
| 5,546,340 | * 8/1996 | Hu et al. | 365/185.3 |
| 5,554,868 | 9/1996 | Hayashikoshi et al. | 257/315 |
| 5,659,550 | 8/1997 | Mehrotra et al. | 371/21.4 |
| 5,668,759 | 9/1997 | Ohtsuki | 365/185.29 |
| 5,715,193 | 2/1998 | Norman | 365/185.02 |
| 5,867,428 | 2/1999 | Ishii et al. | 365/185.24 |
| 5,912,845 | * 6/1999 | Chen et al. | 365/185.3 |
| 5,920,501 | 7/1999 | Norman | 365/185.02 |
| 5,956,473 | 9/1999 | Ma et al. | 395/182.03 |

FOREIGN PATENT DOCUMENTS

| | | |
|---|---|---|
| 6-5823 | 1/1994 | (JP) . |
| 6-37331 | 2/1994 | (JP) . |
| 7-66378 | 3/1995 | (JP) . |
| 7-335843 | 12/1995 | (JP) . |
| 8-138394 | 5/1996 | (JP) . |
| 10-79197 | 3/1998 | (JP) . |

\* cited by examiner

Primary Examiner—Richard Elms
Assistant Examiner—Hien Nguyen
(74) Attorney, Agent, or Firm—Pennie & Edmonds LLP

(57) ABSTRACT

A method of erasing a flash memory in accordance with the present invention comprises: pre-programming to allow all memory cells to have the same threshold voltage; pre-programming verification for verifying whether the pre-programming is successfully executed; erasing memory cells; erasing verification for verifying whether said erasing is successfully executed; recovering over-erased cells, wherein the recovering step is performed under multiple voltages are sequentially applied to the substrate of the over-erased memory cells; and recovery verification for verifying whether the recovery step is successfully executed.

16 Claims, 4 Drawing Sheets

METHOD OF ERASING FLASH MEMORY AND SUBSTRATE VOLTAGE SUPPLY CIRCUIT

BACKGROUND OF THE INVENTION

1. Field of the Invention

The present invention relates to a method of erasing a flash memory and a substrate voltage supply circuit, and more particularly to a method of erasing a flash memory which can recover over-erased cells regardless of the number of over-erased cells on a bit line by applying voltage to a substrate of cells.

2. Description of the prior art

In a stack gate flash memory device, an erasing method comprises the steps of: pre-programming 11; pre-programming verification 12; erasing 13; erasing verification 14; recovery 15 and recovery verification 16 to prevent over-erasing, as shown FIG. 1.

The pre-programming step 11 is executed so that all cells may have high threshold voltage of the program threshold voltage $V_f$, and the pre-programming verification step 12 is to verify whether pre-programming is successfully executed.

The erasing step 13 is to erase memory cells, and the erasing verification 14 is to verify whether memory cell is successfully erased.

Recovery step 15 is executed to recover the threshold voltage of over-erased cells to the desired threshold voltage. The recovery verification step 16 is to verify the recovery state 15.

Recovery is executed for each bit line as shown in FIG. 2 after executing erasing in the conventional stack gate flash memory device. Namely, it is to apply 0V to the gate, 5V to the drain and the ground voltage $V_{SS}$ to the source and the substrate.

However, if considerable over-erased cells (cells of which the threshold voltage is less than 0V) exist on a bit line, the voltage applied to the bit line, that is the voltage applied to the drain, remarkably reduces by the current leaking from the bit line. Reliability of the device is lowered since recovery is not executed or long recovery time is needed due to the reduced voltage.

SUMMARY OF THE INVENTION

Accordingly, it is an object of the present invention to provide a method of erasing a flash memory which can recover over-erased cells regardless of the number of over-erased cells on a bit line by applying voltage to the substrate of cells and also to provide a substrate voltage supply circuit for recovery.

To achieve the above object, a method of erasing a flash memory in accordance with the present invention comprises: pre-programming to allow all memory cells to have the same threshold voltage; pre-programming verification for verifying whether the pre-programming is successfully executed; erasing memory cells; erasing verification for verifying whether said erasing is successfully executed; recovering over-erased cells, wherein the recovering step is performed under multiple voltages are sequentially applied to the substrate of the over-erased memory cells; and recovery verification for verifying whether the recovery step is successfully executed.

Also, a substrate voltage supply circuit for recovery of a flash memory in accordance with the present invention comprises: a first means for sequentially providing the multiple voltages to a substrate of the flash memory according to multiple control signals; and a second means for dropping the potential of the substrate to the ground potential according to the multiple control signals.

BRIEF DESCRIPTION OF THE DRAWINGS

The above object, and other features and advantages of the present invention will become more apparent by describing the preferred embodiment thereof with reference the accompanying drawings, in which.

Similar reference characters refer to similar parts in the several views of the drawings.

DETAILED DESCRIPTION OF THE PREFERRED EMBODIMENTS

Reference will now be made in detail to the preferred embodiments of the present invention, and examples of which are illustrated in the accompanying drawings.

Recovery is executed at the state applying voltage to the substrate of memory cells for recovering over-erased cells in a method of erasing a flash memory.

Figure 1:
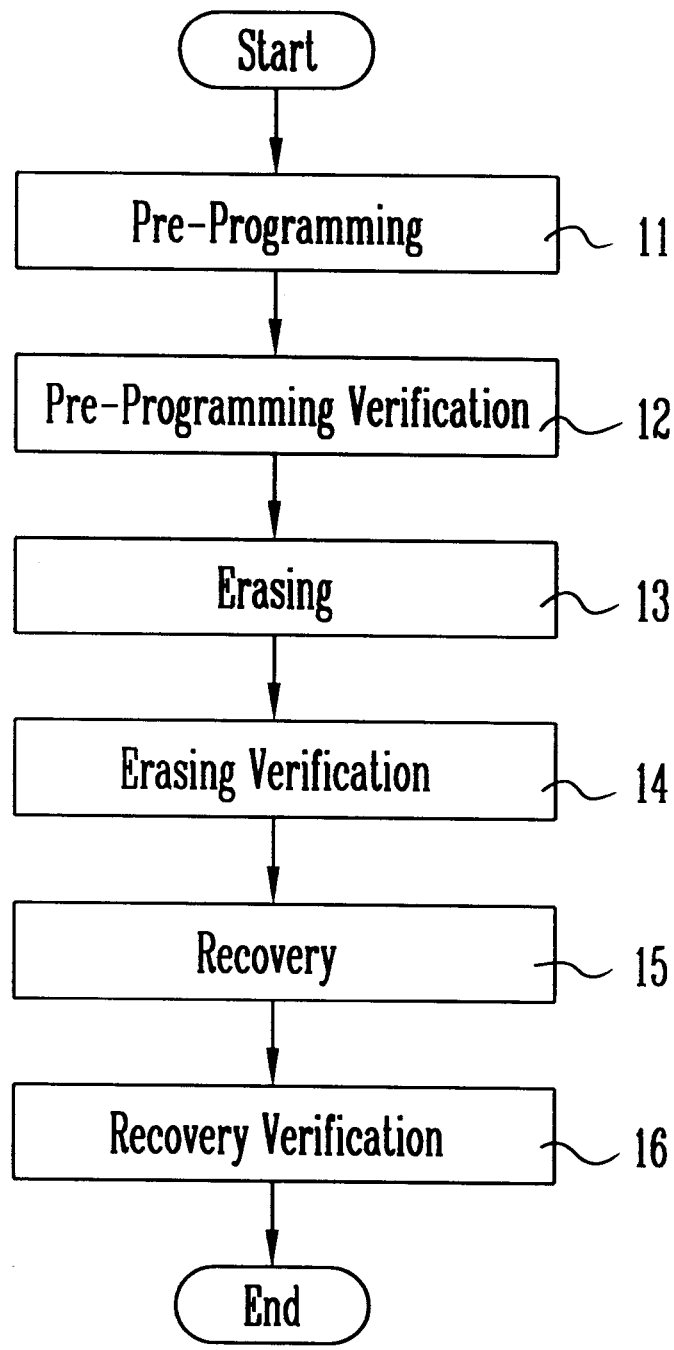
FIG. 1 is a flow chart for explaining a method of erasing a flash memory.
Figure 2:
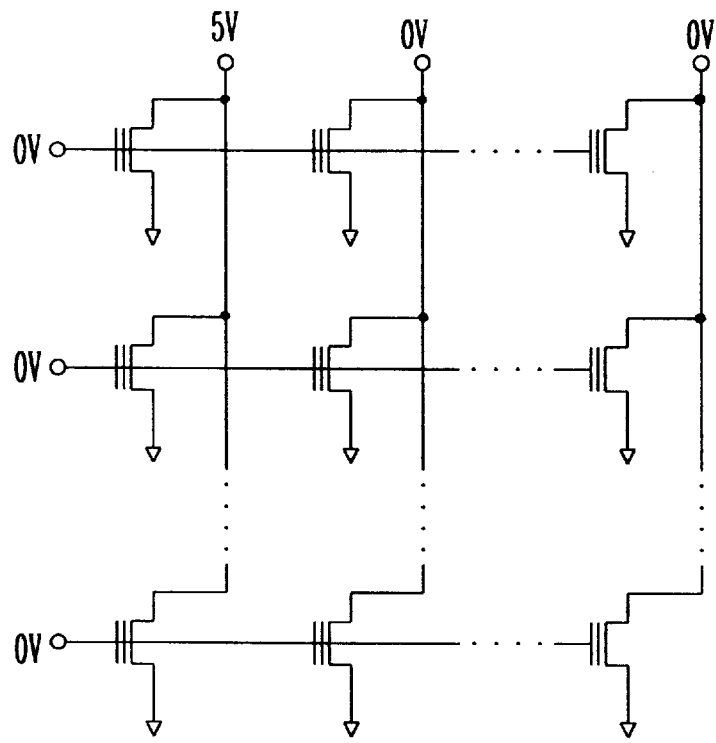
FIG. 2 is a cell array for explaining bias conditions at the time of general recovery.
Figure 3:
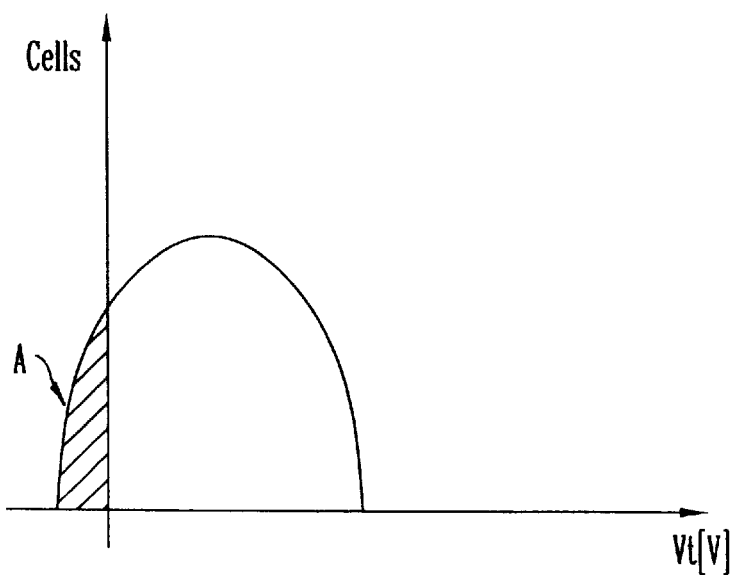
FIG. 3 is a graph for explaining the relationship of cells and threshold voltage after erasing.
Figure 4:
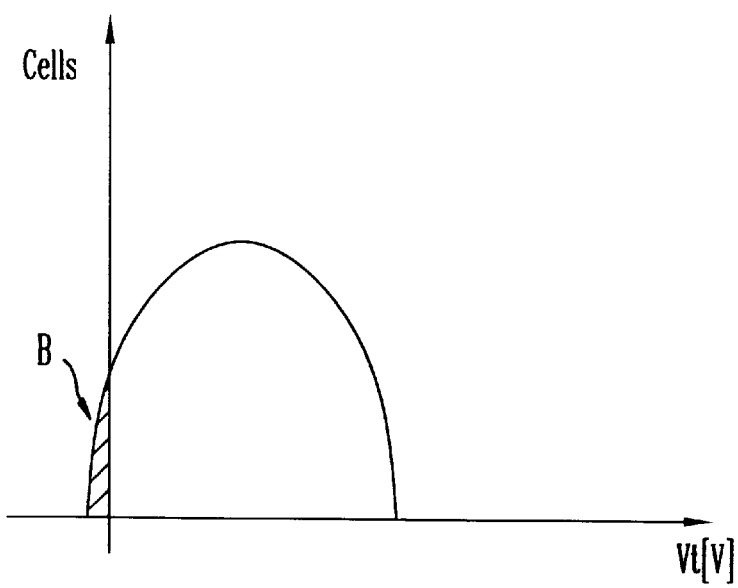
FIG. 4 is a graph for explaining the relationship of cells and threshold voltage after applying voltage to the substrate of cells.
Figure 5:
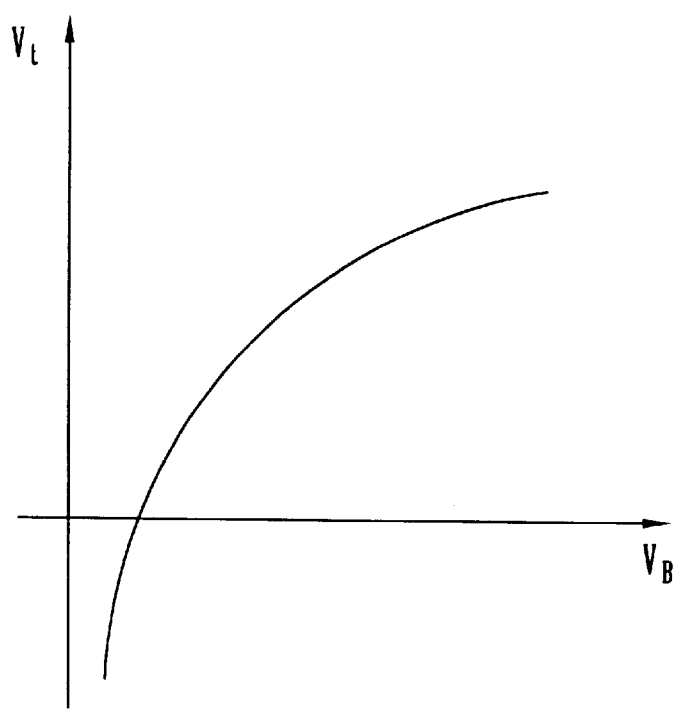
FIG. 5 is a graph for explaining threshold voltage change of cells according to the bias applied to the substrate of cells.

First, the principle applied to the present invention may be described, using FIG. 3, FIG. 4 and FIG. 5, as follows. If erasing is executed, cells with smaller threshold voltage than 0V exists as shown in FIG. 3. Such cells are decided to be over-erased cells. If voltage is applied to the substrate of cells in the relationship of cells and threshold voltage, over-erased cells reduces, as shown in FIG. 4. Namely, if voltage is applied to the substrate of cells, the threshold voltage of cells increases depending on applied voltage and over-erased cells reduces by the increase, as shown in FIG. 5.

If recovery is executed for each bit line by raising the threshold voltage of over-erased cells with the threshold voltage lower than 0V to the voltage higher than 0V, using the above principle, the current leaking in the bit line by over-erased cells disappears and recovery may be effectively executed.

Figure 6:
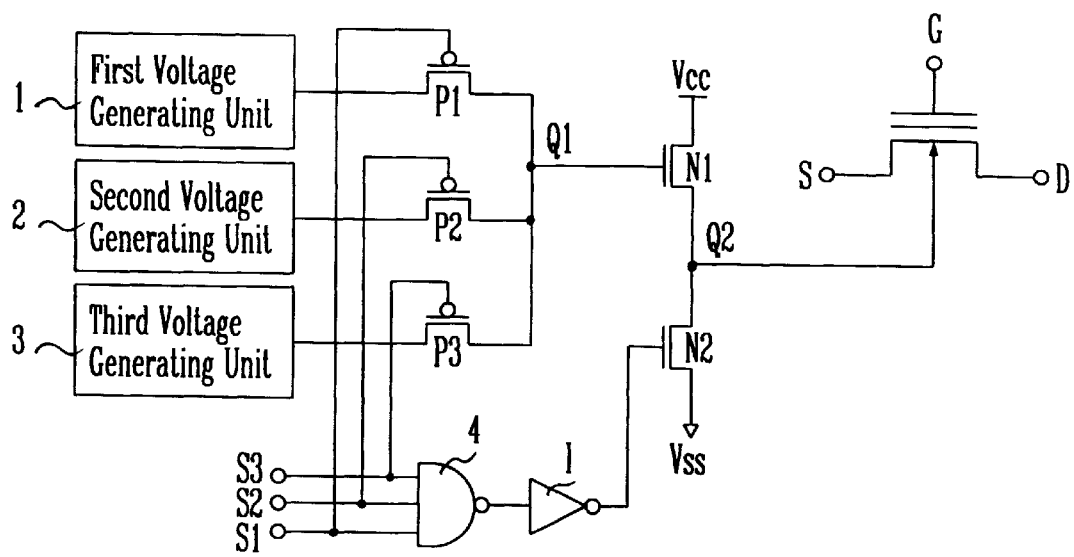
FIG. 6 is a substrate voltage supply circuit for a flash memory in accordance with an embodiment of the present invention.
Figure 7:
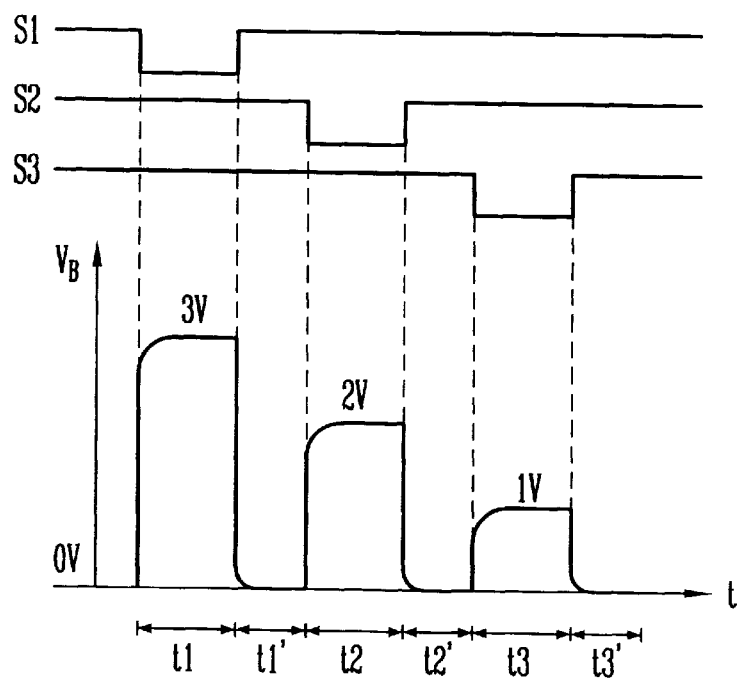
FIG. 7 is a wave form of signals applied to a substrate voltage supply circuit of a flash memory and the bias applied to the substrate of cells in accordance with an embodiment of the present invention.

With reference to FIG. 6 and FIG. 7, a substrate voltage supply circuit of a flash memory in accordance with the present invention will be described.

FIG. 6, illustrates a substrate voltage supply circuit in accordance with an exemplification of the present invention.

First, second and third signals S1, S2 and S3 are inputted to a NAND gate 4. The first, second and third signals S1, S2 and S3 keep the high state and transit to the low state successively. A second NMOS transistor N2, of which a gate electrode is connected to an output terminal of a inverter I to inverse output signals of the NAND gate 4, is connected between an output node Q2 and a ground $V_{SS}$ and drops potential of the output node Q2 to the ground potential. The first, second and third signal S1, S2 and S3 are inputted to a gate electrode of first, second and third PMOS transistors P1, P2 and P3, respectively. The first, second and third transistors P1, P2 and P3 are connected between first, second and third voltage generating units 1, 2 and 3 and a gate electrode of a first NMOS transistor N1, respectively. The first, second and third voltage generating units 1, 2 and 3 generate each different bias voltage, for example voltage of 3V, 2V and 1V. The first NMOS transistor N1, that is a negative NMOS transistor whose threshold voltage is near to 0V, is connected between the power supply and the output node Q2. The NMOS transistor N1 is turned on depending on a potential of a first node Q1. The voltage of the output node Q2 is applied to a substrate of the cell.

Electrical operation of a substrate voltage supply circuit in accordance with the present invention, as described above, is explained with reference to FIG. 7.

If first, second and third signals S1, S2 and S3 are in the high state, first through third PMOS transistors P1 through P3 are turned off and the voltage generated in first, second and third voltage generating units 1, 2 and 3 can not be applied. As the result, a first node Q1 keeps the low state and turns off a first NMOS transistor N1. On the other hand, the first, second and third signals S1, S2 and S3 having the high state are entered to the NAND gate 4 and the output of the NAND gate 4 becomes a low state. The output of the NAND gate 4 is inverted to the high state by an inverter I and a second NMOS transistor N2 is turned on. Accordingly, the output node Q2 keeps potential at the low state, and the substrate potential of cells is dropped to the low state and the cells are initialized.

During t1 time of FIG. 7, if the first signal S1 is the low state and the second and third signals S2 and S3 are the high state, the first PMOS transistor P1 is turned on while the second and third PMOS transistors P2 and P3 are turned off. As the result, the voltage of 3V generated in a first voltage generating unit 1 is applied to a gate electrode of the first transistor N1. Thus, the first NMOS transistor N1 is turned on by the potential of the first node Q1. On the other hand, if the first signal S1 is the low state and the second and third signals S2 and S3 are the high state, output of the NAND gate 4 becomes a high state. The output of the NAND gate 4 is inverted to the low state by the inverter I and the second NMOS transistor N2 is turned off. As the result, the supply voltage applied by the first NMOS transistor N1 is provided to the substrate of cells through the output node Q2. Voltage of about 3V is applied to the substrate of the cells due to characteristics of the first NMOS transistor N1 and the recovery process is executed.

If the recovery process is executed at the state of application of the 3V substrate voltage, the threshold voltage increases as shown in FIG. 4 and over-erased cells reduce.

If the first, second and third signals S1, S2 and S3 are the high state during t1' time of FIG. 7, the voltage of about 3V provided to the substrate of the cells passes to the ground $V_{SS}$ as the same in said initialization process and the output node Q2 and the substrate of the cells get to the state of ground potential.

If the second signal S2 is the low state and the first and third signals S1 and S3 are the high state during t2 time of FIG. 7, the second PMOS transistor P2 is turned on, while the first and third PMOS transistors P1 and P3 are turned off Thus, the first node Q1 keeps potential of about 2V generated in the second voltage generating unit 2, and the first NMOS transistor N1 is turned on by the potential. On the other hand, if the second signal S2 is the low state S2 and the first and third signals S1 and S3 are the high state, an output of the NAND gate 4 becomes the high state. The output of the NAND gate 4 is inverted to the low state by the inverter I and the second NMOS transistor N2 is turned off. Accordingly, supply voltage applied by the first NMOS transistor N1 is provided to the substrate of the cells through the output node Q2. Then voltage of about 2V is applied to the substrate of cells due to the characteristics of the first NMOS transistor and the recovery process is executed.

If the first, second and third signals S1, S2 and S3 are the high state during t2' time of FIG. 7, the voltage of 2V provided to the substrate of cells passes to the ground $V_{SS}$ as the same in the initialization process and the output node Q2 and the substrate of the cells get to the state of ground potential.

If the third signal S3 is low state and the first and third signals S1 and S3 are the high state during t3 time of FIG. 7, the third PMOS transistor P3 is turned on, while the first and the second PMOS transistors P1 and P2 are turned off. As the result, the voltage generated in a third voltage generating unit 3 is applied. Thus, a first node Q1 keeps the potential of about 1V generated by the third voltage generating unit 3 and the first NMOS transistor N1 is turned off by the potential. On the other hand, if the third signal S3 is the low state, while the first and second signals S1 and S2 are the high state, output of the NAND gate 4 is inverted to the low state by the inverter I and the second NMOS transistor N2 is turned off. Accordingly, supply voltage applied by the first NMOS transistor N1 is provided to the substrate of the cells through the output node Q2. Then voltage of about 1V is applied to the substrate of cells due to the characteristics of the first NMOS transistor N1 and the recovery process is executed.

If the first, second and third signals S1. S2 and S3 are the high state during t3' time of FIG. 7, the voltage of about 1V provided to the substrate of the cells passes to the ground $V_{SS}$ as the same in the initialization process, t1' time and t2' time, the output node Q2 and the substrate of the cells gets to the state of the ground potential.

In the above descriptions, 3 types of voltage generating units are shown, but the number of voltage generating units may be in transistor N1 increased when a flash memory is designed. For example, for recovering all of the multiple over-erased cells generated in the process of erasing, it is possible to increase the number from the high voltage to the low voltage and to execute the process described.

As described above the present invention may improve reliability of a device since the recovery process may be executed at the state without being influenced by the number of defective cells in the recovery process executed for each bit line, by executing the recovery process at the state successively applying voltage to the substrate of cells.

While the present invention has been described and illustrated herein with reference to the certain preferred embodiment thereof, those skilled in the art will recognize the many modifications and enhancements in form and details which can be made therein without departing from the true spirit and scope of the invention.

What is claimed is:

1. A method of erasing a flash memory comprising the steps of:

pre-programming to allow all memory cells to have the same threshold voltage;

pre-programming verification of verifying whether said pre-programming step is successfully executed;

erasing memory cells;

erasing verification of verifying whether said erasing step is successfully executed;

recovering over-erased memory cells wherein said recovering step is performed by sequentially applying multiple positive voltages to the substrate of said over-erased memory cells; and verifying whether said recovering step is successfully executed.

2. A method of erasing a flash memory comprising the steps of:

pre-programming to allow all memory cells to have the same threshold voltage;

pre-programming verification of verifying whether said pre-programming step is successfully executed;

erasing memory cells:

erasing verification of verifying whether said erasing step is successfully executed;

recovering over-erased memory cells by sequentially applying multiple voltages to the substrate of said over-erased memory cells; and verifying whether said recovering step is successfully executed, wherein said multiple voltages are supplied from a substrate voltage supply circuit having a first means for sequentially providing said multiple voltages to the substrate of said flash memory according to multiple control signals and a second means for dropping the potential of said substrate to a ground potential according to said multiple control signals.

3. The method of claim 2, wherein said multiple voltages are sequentially applied to the substrate of said over-eras memory cells from high voltage to the low voltage.

4. The method of claim 2, wherein said first means comprises:

multiple voltage generating means for generating said multiple voltages;

first switching means for selectively transmitting said multiple voltages supplied from said multiple voltage generating means according to said multiple control signals; and second switching means for providing said multiple voltages supplied from said first switching means to said substrate.

5. The method of claim 2, wherein said second means comprises:

a detection means receiving said multiple control signals; and a switching means for dropping a substrate potential to ground potential according to an inverted output signal of said detection means.

6. The method of claim 4, wherein said first switching means comprise a plurality of PMOS transistors.

7. The method of claim 4, wherein said second switching means comprises an NMOS transistor.

8. The method of claim 5, wherein said detection means comprises a NAND gate.

9. The method of claim 5, wherein said switching means comprises a NMOS transistor.

10. A method of erasing a flash memory comprising the steps of:

erasing memory cells;

verifying whether the erasing step was successful;

recovering over-erased memory cells by sequentially applying a plurality of different voltage levels to the substrate of over-erased memory cells, wherein said plurality of different voltage levels are supplied from a substrate voltage supply circuit having a first means for sequentially applying said plurality of different voltage levels to the substrate of said flash memory according to multiple control signals and a second means for dropping the potential of said substrate to a ground potential according to said multiple control signals.

11. The method of claim 10, further comprising the step of verifying whether the recovering step was successful.

12. The method of claim 11, further comprising the steps of:

pre-programming to allow all memory cells to have the same threshold voltage; and verifying whether the pre-programming step was successful, prior to the step of erasing the memory cells.

13. The method of claim 10, wherein a total of three different voltage levels are applied.

14. The method of claim 10, wherein the recovering step comprises:

applying a plurality of different voltage levels, each successive voltage level being lower than its predecessor.

15. The method of claim 14, wherein a total of three different voltage levels are applied.

16. A flash memory erasing circuit comprising:

means for erasing memory cells;

means for verifying whether the erasing step was successful; and means for recovering over-erased memory cells comprising a substrate voltage supply circuit having a first means for sequentially applying a plurality of different voltage levels to the substrate of said flash memory according to multiple control signals and a second means for dropping the potential of said substrate to a ground potential according to said multiple control signals.

* * * * *